United States Patent
Miyasaka (10) Patent No.: US 6,352,802 B1
(45) Date of Patent: Mar. 5, 2002

(54) MASK FOR ELECTRON BEAM EXPOSURE AND METHOD OF MANUFACTURING SEMICONDUCTOR DEVICE USING THE SAME

(75) Inventor: Mami Miyasaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/578,476

(22) Filed: May 26, 2000

(30) Foreign Application Priority Data

May 28, 1999 (JP) ............................................. 11-150705

(51) Int. Cl.$^7$ ............................... G03F 9/00; G03C 5/00
(52) U.S. Cl. .......................................... 430/5; 430/296
(58) Field of Search ................... 430/5, 296; 250/492.3; 716/19, 21

(56) References Cited

U.S. PATENT DOCUMENTS 6,153,340 A * 11/2000 Nakasuji ........................ 430/5
6,225,025 B1 * 5/2001 Hoshino ........................ 430/5

* cited by examiner

*Primary Examiner*—S. Rosasco
(74) *Attorney, Agent, or Firm*—McGinn & Gibb, PLLC (57) ABSTRACT

A mask for electron beam exposure used in a process for exposing a wafer with predetermined patterns for a chip by an EB projection lithography system. The mask comprises: a grillage area; a plurality of thin film areas surrounded by the grillage area and having a thickness thinner than that of the grillage area; and a plurality of mask pattern areas each of which is formed within respective one of the thin film areas. Each of the mask pattern areas has mask patterns corresponding to patterns of a subfield obtained by dividing the patterns for a chip into a plurality of areas having substantially the same shape and size. The wafer is exposed with predetermined patterns for a chip by performing, for each of the mask pattern areas, a step of irradiating an electron beam onto the mask for electron beam exposure such that the center of an area irradiated by the electron beam coincides with the center of each of the mask pattern areas.

19 Claims, 6 Drawing Sheets

MASK FOR ELECTRON BEAM EXPOSURE AND METHOD OF MANUFACTURING SEMICONDUCTOR DEVICE USING THE SAME

FIELD OF THE INVENTION

The present invention relates generally to a mask for electron beam exposure used in an exposure process in which an electron beam (EB) is irradiated onto a semiconductor wafer via the mask for electron beam exposure to pattern a resist film on the semiconductor wafer, and to a method of manufacturing a semiconductor device using such mask. More particularly, the present invention relates to a mask for electron beam exposure used in an exposure process which is performed by using an EB projection lithography system, and to a method of manufacturing a semiconductor device using such mask.

BACKGROUND OF THE INVENTION

Conventionally, in a manufacturing process of a semiconductor device, an exposure process for exposing a resist film on a semiconductor wafer, here an electron beam resist film, with an electron beam was performed by using a cell projection EB system to pattern the resist film. In this system, an electron beam is irradiated onto an area of, for example, 125 micrometers($\mu$m)×125 micrometers of a mask for electron beam exposure. The mask for electron beam exposure has mask patterns comprising trenches or openings for passing an electron beam therethrough. An image of the mask patterns is reduced, for example, to $\frac{1}{25}$ and projected onto the semiconductor wafer by the electron beam passing through the mask for electron beam exposure. Therefore, by one shot of the exposure, an area of 5 micrometers×5 micrometers on the semiconductor wafer, that is, an area of 5 micrometers×5 micrometers of a resist film formed on the semiconductor wafer, is exposed by an electron beam having patterns corresponding to the mask patterns.

In order to fabricate one semiconductor device or one semiconductor chip, it is necessary to expose a resist film on a semiconductor wafer with patterns corresponding to one whole semiconductor chip, that is, patterns for a chip or chip patterns, and to pattern the resist film by the exposed chip patterns. In the cell projection EB system, a mask for electron beam exposure has a mask pattern area corresponding to a pattern area which is a part of an area of the patterns for one chip and which is repeated to obtain the patterns for one chip. Exposure steps by using such mask for electron beam exposure are repeated, while, for example, shifting the location of a semiconductor wafer with respect to the mask. Thereby, the resist film on the semiconductor wafer is exposed by the patterns for a chip, and is then developed to obtain a patterned resist film.

However, in the above-mentioned cell projection EB system, the area on the semiconductor wafer exposed at a time is not sufficiently large. Therefore, the number of electron beam shots required to expose a resist film on a semiconductor wafer by predetermined patterns for a chip becomes relatively large. As result thereof, the time required for an exposure process becomes long, and it is impossible to raise throughput of semiconductor manufacturing sufficiently high.

In order to realize a remarkable improvement in the throughput of semiconductor device manufacturing, there began to be proposed an EB projection lithography system, approximately from the year 1990. In this system, an electron beam having a large cross sectional area is used, and it becomes possible to irradiate the electron beam onto a relatively large area, for example, an area of 1 mm×1 mm, on a mask for electron beam exposure, at a time. The mask for electron beam exposure has mask patterns comprising trenches or openings for passing an electron beam therethrough. Mask pattern image is reduced to, for example, $\frac{1}{4}$ and projected onto a semiconductor wafer by the electron beam passing through the mask for electron beam exposure. Therefore, by one shot of exposure, it is possible to expose a large area on a semiconductor wafer, here an area of 250 micrometers×250 micrometers, by an electron beam having patterns corresponding to the mask patterns.

The inventor of the present invention studied and considered on a mask for electron beam exposure used in such EB projection lithography. As a result thereof, it was found that the mask for electron beam exposure can be fabricated as follows. A resist film on a semiconductor wafer must be exposed and patterned such that circuit patterns of a whole area of each chip, that is, patterns for a chip, are repeatedly exposed and formed. Patterns for one chip are divided into a plurality of small pattern areas or subfields, and patterns corresponding to each of the subfields are formed on one mask for electron beam exposure.

Figure 6A:
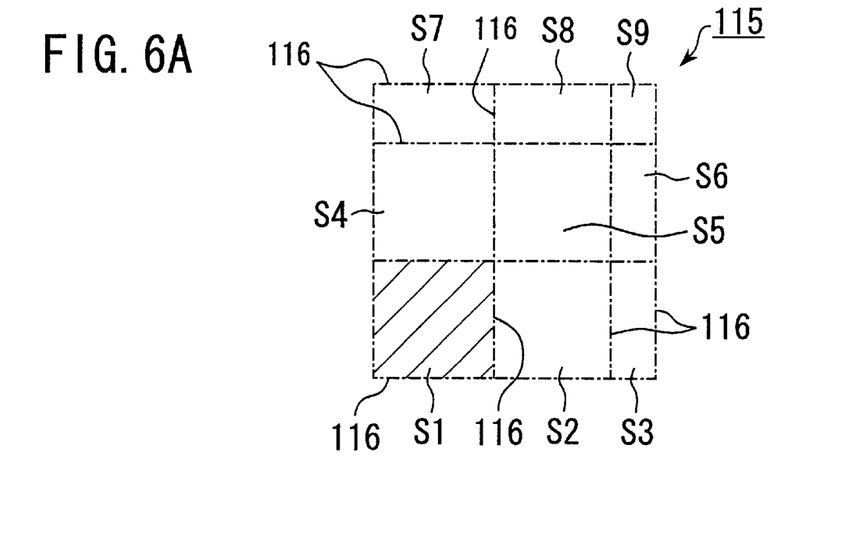
FIG. 6A is a plan view schematically showing a way of dividing one chip pattern into a plurality of subfields to fabricate a mask for electron beam exposure.
Figure 6B:
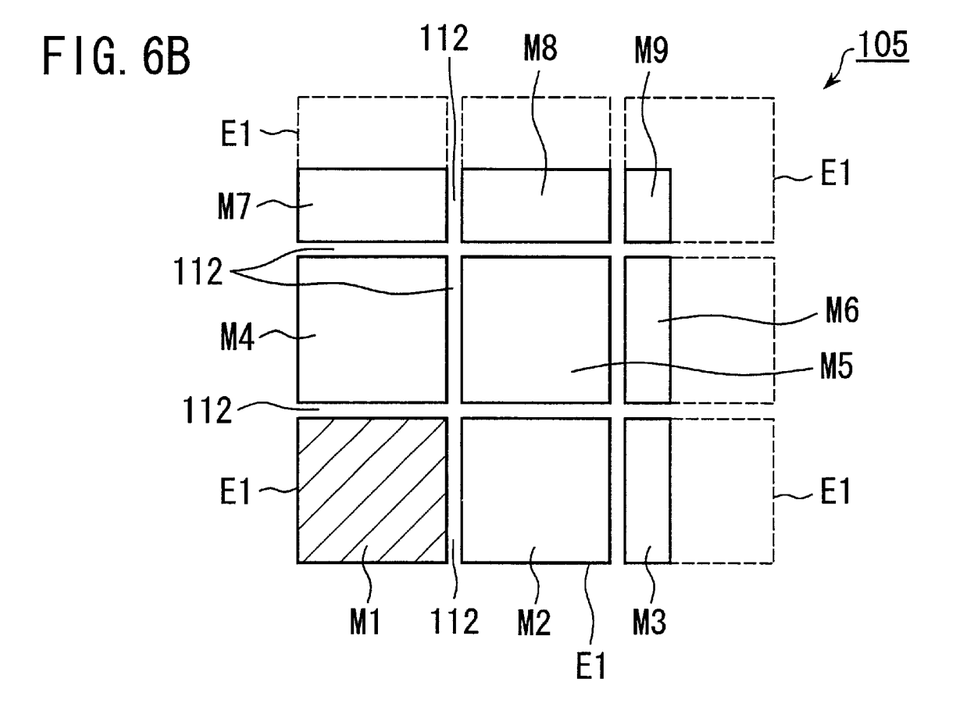
FIG. 6B is a plan view showing a schematic structure of a mask for electron beam exposure used for forming the chip pattern divided into subfields shown in FIG. 6A.

FIG. 6A is a plan view schematically showing a manner of dividing patterns for one chip into a plurality of subfields to fabricate a mask for electron beam exposure. FIG. 6B is a plan view showing a schematic structure of a mask for electron beam exposure considered by the inventor.

Patterns for one chip 115 are simply divided into a plurality of subfields per a maximum exposure area E2. The maximum exposure area is an area on a semiconductor wafer which is substantially exposed when it is assumed that the whole of an electron beam irradiated onto a mask for electron beam exposure passes thorough the mask for electron beam exposure and is exposed onto a semiconductor wafer by an exposure of one shot. In the above-mentioned example, a square area of 250 micrometers×250 micrometers on the semiconductor wafer corresponds to the maximum exposure area E2. In the example of FIG. 6A, a chip pattern area 115 is divided into 9 (nine) subfields S1 through S9, by division lines 116 provided every 250 micrometers both in a vertical direction and in a horizontal direction. Then, as shown in FIG. 6B, mask patterns which correspond to patterns obtained by enlarging the patterns of the subfields S1 through S9 four times respectively are formed in mask pattern areas M1–M9 between grillage areas 112 of a mask for electron beam exposure 105. In this case, the mask for electron beam exposure 105 is a 4×mask.

An electron beam is irradiated on each of the mask pattern areas M1 through M9 of the mask for electron beam exposure 105 shown in FIG. 6B, and predetermined portions of a resist film on the semiconductor wafer are sequentially exposed by the electron beam passed through the mask for electron beam exposure 105. In this case, the mask 105 and the semiconductor wafer are both intermittently shifted-relative to the electron beam. Thereby, the resist film formed on the semiconductor wafer can be exposed by the chip pattern 115 shown in FIG. 6A.

However, it is not always true that dimensions in a vertical direction and in a horizontal direction of the chip pattern 115 are respectively multiples of dimensions in a vertical direction and in a horizontal direction of the above-mentioned maximum exposure area, here both 250 micrometers. Therefore, the size and shape of all the subfields are not always constant. That is, the size of some of the subfields may become much smaller than that of the other subfields.

Also, the shape of some of the subfields may become different from that of the other subfields. For example, in the example of FIG. 6A, the size of each of the subfields S3, S6, S7, S8 and S9 located along the right side end and the upper side end of the chip pattern 115 becomes much smaller than the size of each of the other subfields S1, S2, S4 and S5, that is, 250 micrometers×250 micrometers. The dimensions of the mask pattern areas M1–M9 in a vertical direction and in a horizontal direction are four times the dimensions of the subfields F1–F9 in a vertical direction and in a horizontal direction, respectively. Therefore, as shown in FIG. 6B, among the mask pattern areas M1 through M9 of the mask for electron beam exposure 105, the size of each of the mask pattern areas M3, M6, M7, M8 and M9 formed along the right side end and upper side end becomes much smaller than that of each of the other mask pattern areas M1, M2, M4 and M5, that is, 1 mm×1 mm.

The mask for electron beam exposure is fabricated by a process including an etching process for forming trenches or openings corresponding to the mask patterns on a wafer for fabricating the mask. In the mask for electron beam exposure 105 shown in FIG. 6B, in a process of etching a wafer for fabricating the mask, an etching rate of the trenches or openings for the mask pattern areas M3, M6, M7, M8 and M9 and an etching rate of the trenches or openings for the mask pattern areas M1, M2, M4 and MS differ much from each other due to the microloading effect. Therefore, the size of the trench or opening varies depending on the mask patterns, and there is a possibility that precision of sizes of the mask patterns formed on the mask for electron beam exposure is deteriorated. Thus, there is a possibility that the resist film having predetermined chip patterns is not formed with precision.

Also, in case the mask for electron beam exposure 105 shown in FIG. 6B is used, an electric current value of an electron beam passing through each of the mask pattern areas M3, M6, M7, M8 and M9 and an electric current value of an electron beam passing through each of the mask pattern areas M1, M2, M4 and M5 differ from each other largely. Therefore, a degree of electron beam blur of an electron beam irradiated onto a semiconductor wafer, caused by the coulomb effect, differs largely depending on which mask pattern area the electron beam has passed. Thus, there is a possibility that precision of sizes of the resist film patterns formed on the semiconductor wafer is deteriorated. Also, depending on the variation of degree of electron beam blur, degree of focusing an electron beam irradiated onto the semiconductor wafer also varies. It is difficult to perform an exposure process of a semiconductor wafer while compensating largely the degree of focusing an electron beam for each mask pattern area. When the variation of the degree of focusing an electron beam is large, there is a possibility that the variation of degree of focusing an electron beam is out of compensation by an exposure apparatus, and that the resist film on a semiconductor wafer is not exposed with predetermined patterns with precision.

Each of the mask pattern areas M1, M2, M4 and MS has the same size as that of an electron beam irradiation area E1 on the mask onto which an electron beam is substantially irradiated by one shot of exposure, that is, an area of 1 mm×1 mm in the above-mentioned example. However, a distribution of intensity of an electron beam irradiated onto the mask for electron beam exposure is not completely uniform within the electron beam irradiation area E1 on the mask. In general, an intensity of an electron beam becomes lower in a peripheral portion than in the central portion. Therefore, a distribution of intensity of an electron beam irradiated onto each of the mask pattern areas M1, M2, M4 and M5 is not uniform within each mask pattern area, and an electron beam intensity in a peripheral area becomes smaller than that in the central area within each mask pattern area. Similarly, a distribution of intensity of an electron beam irradiated onto each of the mask pattern areas M3, M6, M7, M8 and M9 is not uniform within each mask pattern area. Therefore, the intensity of the electron beam irradiated onto the semiconductor wafer via the mask for electron beam exposure varies depending on the location on the semiconductor wafer, and there is a possibility that precision of sizes of the resist film patterns formed on the semiconductor wafer is deteriorated.

In the EB projection lithography system, a low magnification mask, such as 4×mask mentioned above, is used as a mask for electron beam exposure, taking a structure of the electron beam exposure apparatus in the system into consideration. This is because, if a high magnification mask is used in the EB projection lithography system, the sizes of the mask and a mask stage for placing the mask must be relatively large, so that it becomes difficult to accurately perform location control of the mask stage. Therefore, when compared with the above-mentioned conventional cell projection EB system in which a mask for electron beam exposure having a magnification from 25× to 60× is used, it is necessary to use, in the EB projection lithography system in which a low magnification mask is used, a mask for electron beam exposure in which mask patterns are more accurately formed.

SUMMARY OF THE INVENTION

Therefore, it is an object of the present invention to provide a mask for electron beam exposure which is usable with precision in an EB projection lithography system and a method of manufacturing a semiconductor device using such mask.

It is another object of the present invention to provide a mask for electron beam exposure by which a resist film on a semiconductor wafer can be precisely exposed with an electron beam of predetermined patterns and a method of manufacturing a semiconductor device using such mask.

It is still another object of the present invention to provide a mask for electron beam exposure by which predetermined resist film patterns can be precisely formed on a semiconductor wafer and a method of manufacturing a semiconductor device using such mask.

It is still another object of the present invention to provide a mask for electron beam exposure in which mask patterns are precisely formed and a method of manufacturing a semiconductor device using such mask.

It is still another object of the present invention to provide a mask for electron beam exposure by which a resist film on a semiconductor wafer can be precisely exposed with an electron beam of predetermined patterns and by which throughput of an exposure process can be improved and to provide a method of manufacturing a semiconductor device using such mask.

It is still another object of the present invention to provide a mask for electron beam exposure by which predetermined resist film patterns can be formed on a semiconductor wafer with precision and with high throughput and to provide a method of manufacturing a semiconductor device using such mask.

According to an aspect of the present invention, there is provided a mask for electron beam exposure used in a process for exposing a wafer with predetermined patterns for a chip by an EB projection lithography system, the mask comprising: a grillage area; a plurality of thin film areas surrounded by the grillage area and having a thickness thinner than that of the grillage area; and a plurality of mask pattern areas each of which is formed within respective one of the thin film areas, each of the mask pattern areas has mask patterns corresponding to patterns of a subfield obtained by dividing the patterns for a chip into a plurality of areas having substantially the same shape and size.

In this case, it is preferable that each of the mask pattern areas is smaller than an area irradiated by an electron beam on the mask for electron beam exposure when the electron beam is irradiated onto the mask for electron beam exposure.

It is also preferable that when the electron beam is irradiated onto the mask for electron beam exposure such that the center of an area irradiated by the electron beam coincides with the center of each of the mask pattern areas, the each of the mask pattern area is included within the area irradiated by the electron beam.

It is further preferable that when the electron beam is irradiated onto the mask for electron beam exposure such that the center of an area irradiated by the electron beam coincides with the center of each of the mask pattern areas, a distribution of intensity of the electron beam within each of the mask pattern areas is substantially uniform.

It is advantageous that the center of each of the mask pattern areas substantially resides in the center of each of the thin film areas surrounded by the grillage area.

It is also advantageous that a non-patterned area exists around each of the mask pattern areas and within corresponding one of the thin film areas.

It is further advantageous that each of the mask pattern areas verges on the grillage area.

It is also preferable that a space between the mask pattern areas is determined such that an area irradiated onto a mask pattern area by the electron beam does not overlap with other mask pattern areas when the electron beam is irradiated onto the mask for electron beam exposure such that the center of an area irradiated by the electron beam coincides with the center of each of the mask pattern areas.

According to another aspect of the present invention, there is provided a method of manufacturing a semiconductor device which uses an EB projection lithography system, the method comprising: exposing a wafer with predetermined patterns for a chip by using a mask for electron beam exposure which mask has: a grillage area; a plurality of thin film areas surrounded by the grillage area and having a thickness thinner than that of the grillage area; and a plurality of mask pattern areas each of which is formed within respective one of the thin film areas, each of the mask pattern areas has mask patterns corresponding to patterns of a subfield obtained by dividing the patterns for a chip into a plurality of areas having substantially the same shape and size; wherein the wafer is exposed with predetermined patterns for a chip by performing, for each of the mask pattern areas, a step of irradiating an electron beam onto the mask for electron beam exposure such that the center of an area irradiated by the electron beam coincides with the center of each of the mask pattern areas.

It is preferable that each of the mask pattern areas is smaller than an area irradiated by the electron beam on the mask for electron beam exposure.

It is also preferable that when the electron beam is irradiated onto the mask for electron beam exposure such that the center of an area irradiated by the electron beam coincides with the center of each of the mask pattern areas, each of the mask pattern area is included within the area irradiated by the electron beam.

It is further preferable that the center of each of the mask pattern areas substantially resides in the center of each of the thin film areas surrounded by the grillage area.

It is advantageous that a non-patterned area exists around each of the mask pattern areas and within corresponding one of the thin film areas.

It is also advantageous that each of the mask pattern areas verges on the grillage area.

It is further advantageous that a space between the mask pattern areas is determined such that an area irradiated onto a mask pattern area by the electron beam does not overlap with other mask pattern areas when the electron beam is irradiated onto the mask for electron beam exposure such that the center of an area irradiated by the electron beam coincides with the center of each of the mask pattern areas.

BRIEF DESCRIPTION OF THE DRAWINGS

These and other features, and advantages, of the present invention will be more clearly understood from the following detailed description taken in conjunction with the accompanying drawings, in which, like reference numerals designate identical or corresponding parts throughout the figures, and in which.

DESCRIPTION OF A PREFERRED EMBODIMENT

A mask for electron beam exposure according to the present invention is used in an exposure process using an EB projection lithography system. As mentioned above, in the EB projection lithography system, a shaped electron beam is irradiated onto a large area on the mask for electron beam exposure at a time, and an image corresponding to a mask pattern and composed of an electron beam passing through the mask for electron beam exposure is reduced and projected onto a semiconductor wafer. Thereby, a resist film formed on the semiconductor wafer, here, an electron beam resist film, is exposed by an electron beam with predetermined patterns.

As an example, in the embodiments described below, a shaped electron beam is irradiated onto a square area of 1 mm×1 mm, and a mask pattern image composed of an electron beam passing through the mask for electron beam exposure is reduced to ¼ and projected onto a semiconductor wafer. Therefore, in the embodiments described below, the mask for electron beam exposure is a 4×mask. However, the present invention is not limited to using such mask having a particular magnification.

Figure 1A:
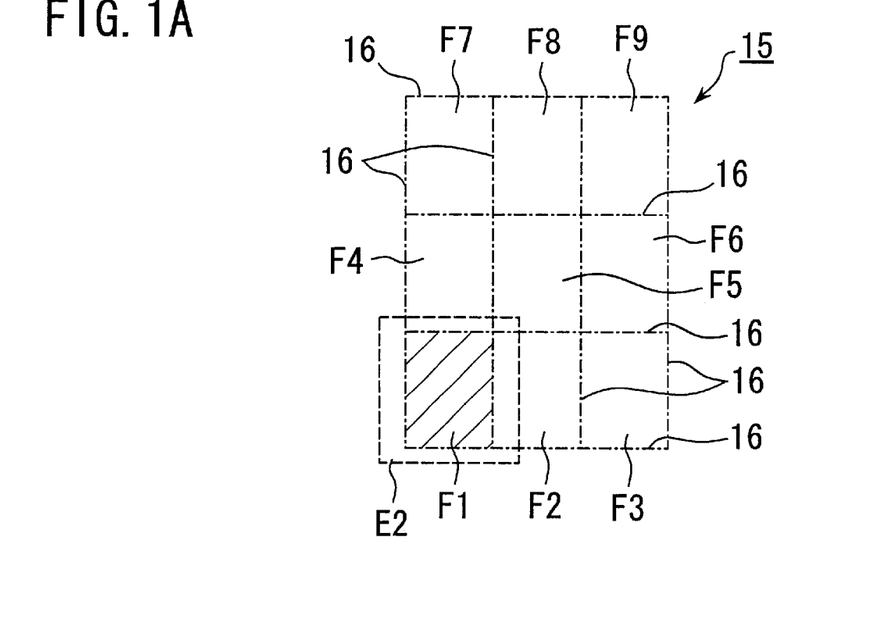
FIG. 1A is a plan view schematically showing a whole image of a chip pattern which is to be exposed onto a resist film on a semiconductor wafer in accordance with the present invention.
Figure 1B:
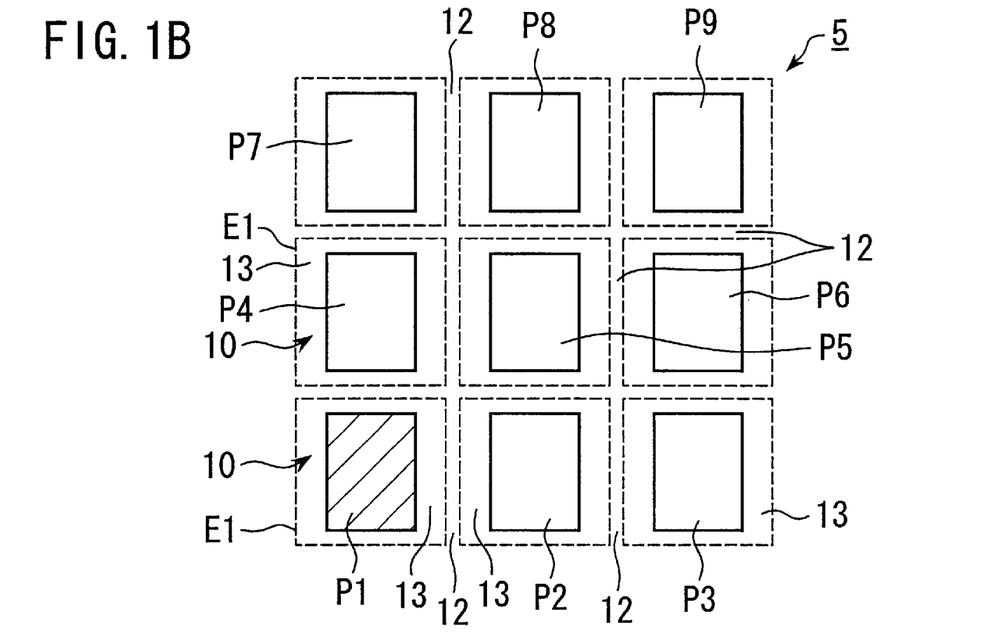
FIG. 1B is a plan view schematically showing a structure of a mask for electron beam exposure according to an embodiment of the present invention, which mask is used for exposing a resist film on a semiconductor wafer by the chip pattern shown in FIG. 1A.
Figure 2A:
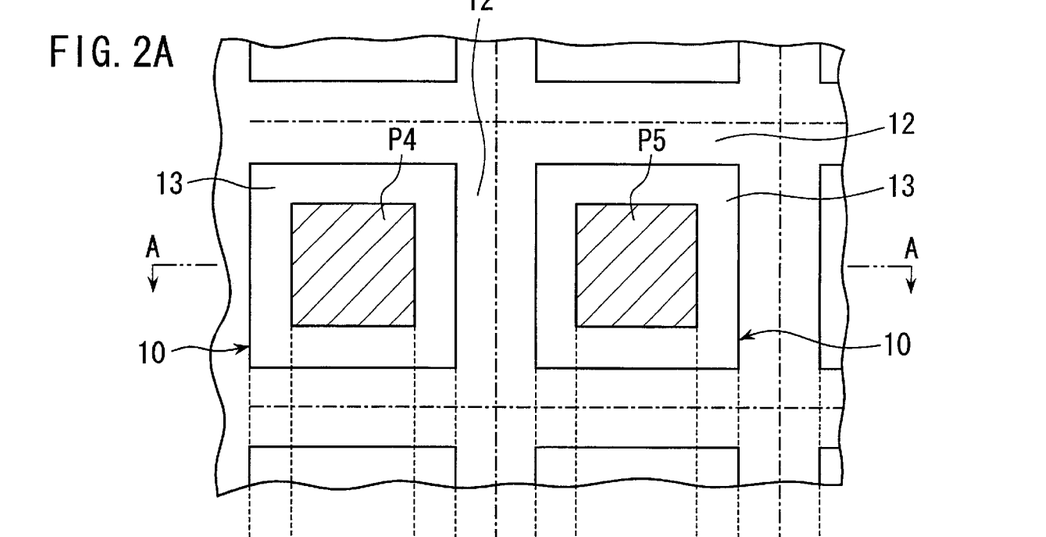
FIG. 2A is a partial enlarged plan view showing a structure of the mask for electron beam exposure shown in FIG. 1B.
Figures 2B, 2C:
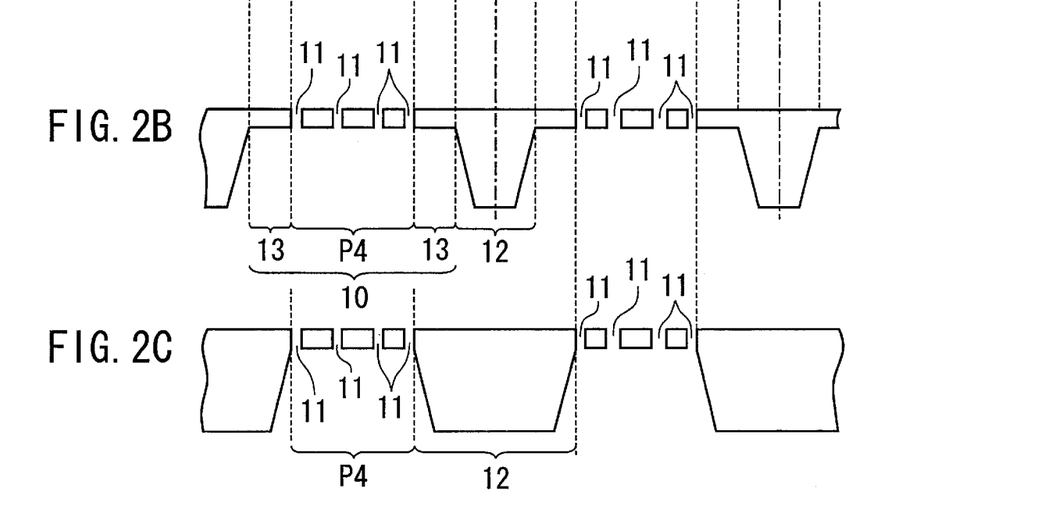
FIG. 2B is a cross sectional view taken on line A—A of FIG. 2A.
FIG. 2C is a cross sectional view corresponding to FIG. 2B showing a structure of a mask for electron beam exposure according to another embodiment of the present invention.

FIG. 1A schematically shows a whole image of chip patterns for one chip which are to be exposed onto a resist film on a semiconductor wafer. FIG. 1B schematically shows a structure of a mask for electron beam exposure according to the present invention, which mask is used for exposing a resist film on a semiconductor wafer by the chip patterns shown in FIG. 1A. FIG. 2A is a partial enlarged plan view schematically showing the mask for electron beam exposure shown in FIG. 1B. FIG. 2B is a cross sectional view taken along a line A—A of FIG. 2A. FIG. 2C is a cross sectional view corresponding to FIG. 2B showing a structure of a mask for electron beam exposure according to another embodiment of the present invention.

First, an explanation will be made on a structure of a mask for electron beam exposure according to an embodiment of the present invention.

As shown in FIG. 1B, FIG. 2A and FIG. 2B, the mask for electron beam exposure 5 according to this embodiment comprises a grillage area 12, and thin film areas 10 each of which is surrounded by the grillage area 12. The grillage area 12 is thicker than the thin film areas 10. Therefore, the grillage area 12 functions to increase thermal conductivity and mechanical strength of the mask for electron beam exposure 5. The size and also the shape of each of the thin film areas 10 are substantially the same throughout all the thin film areas 10. Also, each of the thin film areas 10 has the same shape and size as those of an area on the mask for electron beam exposure 5 which is substantially irradiated by an electron beam by an exposure of one shot, that is, an area irradiated by an electron beam or an electron beam irradiation area E1. The thin film area 10 has, for example, a square shape of 1 mm×1 mm. In each of the thin film areas 10, there are formed mask patterns comprising trenches or openings 11 which pass an electron beam thererthrough. A rectangular or square area in the thin film area 10 where mask patterns are to be formed is shown in FIG. 1B, FIG. 2A and FIG. 2B as a mask pattern area P1, P2, ..., P8, or P9. Also, an area in the thin film area 10 in which the mask patterns are not formed and which is a peripheral area of each mask pattern area P1, P2, ..., P8, or P9 is shown in FIG. 1B and FIG. 2A as a non-patterned area 13. The center of each of the mask patterns P1–P9 coincides with the center of the corresponding one of the thin film areas 10, that is, the center of a corresponding area surrounded by the grillage area 12. The mask pattern areas P1–P9 of the mask for electron beam exposure 5 according to the present embodiment have substantially the same shape and size. Also, the size of each of the mask pattern areas P1–P9 is smaller than that of the electron beam irradiation area E1. That is, the sizes of each mask pattern area P1–P9 in a vertical direction and in a horizontal direction are respectively smaller than the sizes of the electron beam irradiation area E1 in a vertical direction and in a horizontal direction, both 1 mm here. Further, there exist the non-patterned areas 13 between the mask pattern areas P1–P9 and the grillage area 12.

As in another embodiment shown in FIG. 2C, it is possible to omit the non-patterned area 13 in the thin film area 10, and to enlarge the width of the grillage area 12 accordingly. In this case, the mask pattern areas P1–P9 verge on the grillage area 12. In such case, the rate of the grillage area 12 having a large thickness becomes large in the whole area of the mask for electron beam exposure. Therefore, thermal conductivity and mechanical strength of the mask for electron beam exposure can be relatively large, so that a warp or strain of the mask can be small and a dimensional precision of the mask can be further improved.

Now, description will be made on the mask patterns formed in each of the mask pattern areas P1–P9.

In order to fabricate a semiconductor device or a semiconductor chip, it is necessary to expose and pattern a resist film on a semiconductor wafer with patterns corresponding to a whole chip area, that is, patterns for a chip. The whole image of the patterns for a chip is shown in FIG. 1A. If it is impossible to expose the resist film on the semiconductor wafer by an electron beam corresponding to the whole patterns for a chip at a time, it is necessary to divide the patterns for a chip into a plurality of small pattern areas or subfields and to expose the resist film on the semiconductor wafer every subfield. In FIG. 1A, the patterns for a chip 15 is divided into the subfields F1–F9 by chip division lines 16 disposed at equal spaces both in a vertical direction and in a horizontal direction.

In this embodiment, it is necessary to divide the patterns for a chip 15 such that the subfields F1–F9 have equal shape and size and the size of each of the subfields F1–F9 becomes smaller than that of the maximum exposure area E2. Each of the subfields F1–F9 may have a square shape, a rectangular shape or the like.

Here, the maximum exposure area E2 means an area on a semiconductor wafer which is substantially exposed when it is assumed that the whole of an electron beam irradiated onto a mask for electron beam exposure passes thorough the mask and is projected onto a semiconductor wafer by an exposure of one shot. In the present embodiment in which an electron beam is irradiated onto a square area of 1 mm×1 mm of the mask for electron beam exposure and a mask pattern image composed of an electron beam passing through the mask is reduced to ¼ and projected onto a semiconductor wafer, a square area of 250 micrometers×250 micrometers on the semiconductor wafer corresponds to the maximum exposure area E2. Therefore, the subfields F1–F9 substantially have mutually equal shape and size, and sizes of each of the subfields F1–F9 in a vertical direction and in a horizontal direction are respectively smaller than the sizes of the maximum exposure area E2 in a vertical direction and in a horizontal direction, both 250 micrometers here.

The mask for electron beam exposure 5 in this embodiment is a 4×mask, that is, a mask having a magnification×4. Therefore, patterns obtained by magnifying patterns of each of the subfields F1–F9 four times both in a vertical direction and in a horizontal direction corresponds to mask patterns of the corresponding mask pattern are as P1–P9. For example, trenches or openings are formed in the mask pattern area P1 such that patterns formed by the trenches or openings correspond to the patterns obtained by magnifying patterns of the subfield F1 four times both in a vertical direction and in a horizontal direction. As mentioned above, the sizes of each of the subfields F1–F9 in the vertical direction and in the horizontal direction are respectively smaller than the sizes of the maximum exposure area E2 in the vertical direction and in the horizontal direction, both 250 micrometers here. Therefore, the sizes of each of the mask pattern areas P1–P9 in the vertical direction and in the horizontal direction, respectively become smaller than the sizes of the electron beam irradiation area E1 in the vertical direction and in the horizontal direction, both 1 mm here.

Figure 3:
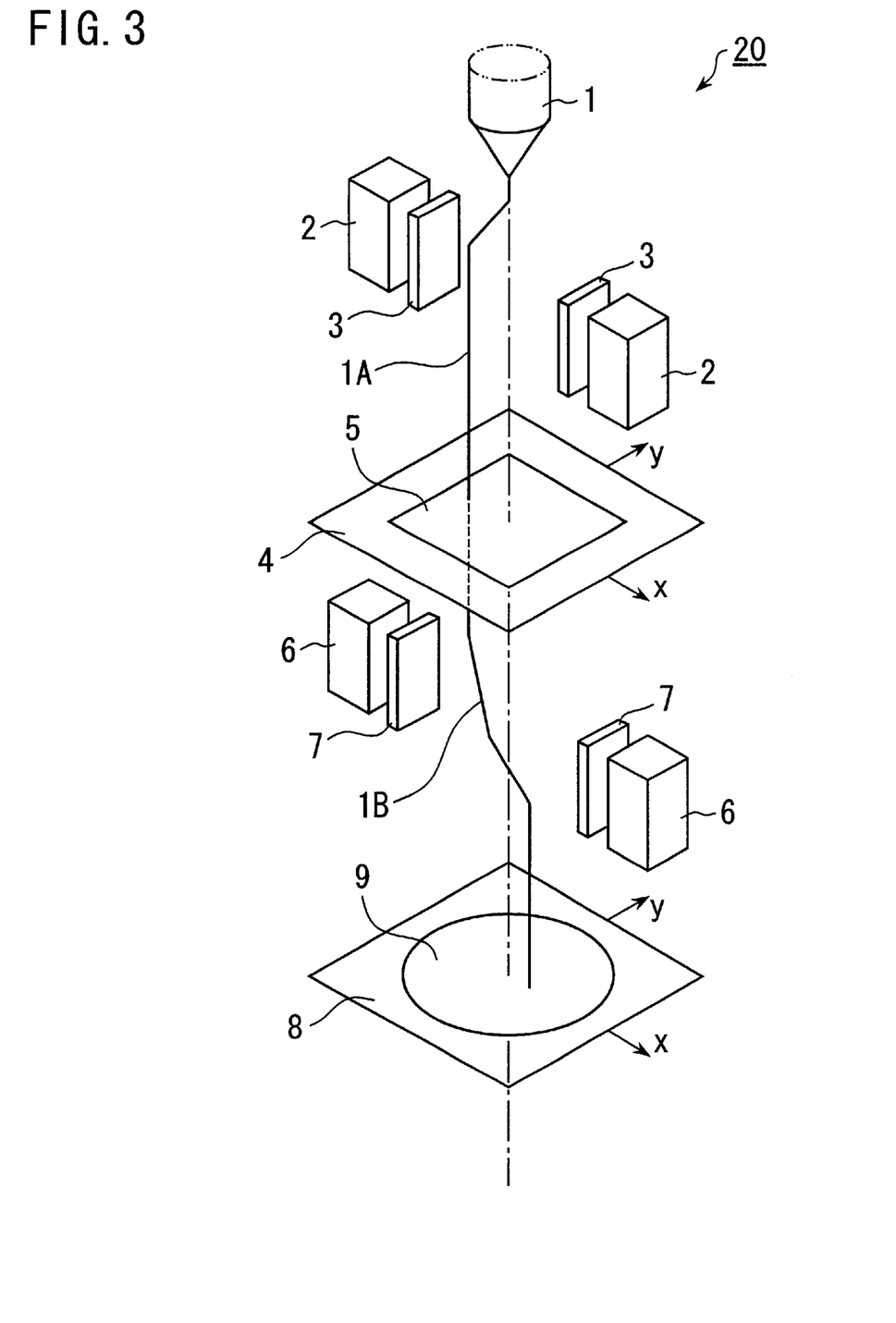
FIG. 3 is a schematic perspective view illustrating a structure of an exposure apparatus used when a semiconductor wafer is exposed by using the mask for electron beam exposure according to the present embodiment.

An explanation will be made on an exposure apparatus used in an exposure process which uses the mask for electron beam exposure according to the present embodiment. FIG. 3 illustrates a schematic, structure of the exposure apparatus used when a semiconductor wafer is exposed by using the mask for electron beam exposure according to the present embodiment.

The exposure apparatus shown in FIG. 3 and designated by a reference numeral 20 is a generally used exposure apparatus which is called a doublet optical system. The exposure apparatus 20 comprises an electron gun 1 for generating an electron beam, a projection lens 2 and a deflector 3 disposed under the electron gun 1, and a mask stage 4 disposed under the projection lens 2 and the deflector 3. The exposure apparatus 20 further comprises another reflector 7 and an objective lens 6 disposed under the mask stage 4, and a wafer stage 8 disposed under the reflector 7 and the objective lens 6. The above-mentioned mask for electron beam exposure 5 is placed on the mask stage 4. It is possible to controllably move the mask stage 4 such that the mask for electron beam exposure 5 placed on the mask stage 4 intermittently moves along directions parallel to the upper surface of the mask 5, that is, in x direction and in y direction. On the wafer stage 8, there is placed a semiconductor wafer 9. A resist film, here, an electron beam resist film, is previously formed on the upper surface of the semiconductor wafer 9. It is also possible to controllably move the wafer stage 8 such that the semiconductor wafer 9 placed on the wafer stage 8 intermittently moves along directions parallel to the upper surface of the wafer 9, that is, in x direction and in y direction.

Next, an explanation will be made on an operation of the exposure apparatus 20 in an exposure process using the mask for electron beam exposure according to the present embodiment.

An electron beam 1A emitted from the electron gun 1 and shaped by a shaping mask and the like not shown in the drawing propagates toward the mask for electron beam exposure 5. The electron beam 1A is deflected, for example, toward x direction, if necessary, and focused by the projection lens 2, and irradiated onto an area including a predetermined mask pattern area of the mask for electron beam exposure 5, for example, a mask pattern area P1. In this case, it is preferable that the electron beam is irradiated onto the mask for electron beam exposure 5 such that the center of the area on the mask for electron beam exposure 5 irradiated by the electron beam coincides with the center of the mask pattern area P1. As mentioned above, the size of the mask pattern area P1 is smaller than the size of the electron beam irradiation area E1. Therefore, whole of the mask pattern area P1 is included in the area on the mask for electron beam exposure 5 irradiated by the electron beam. In case the mask for electron beam exposure 5 according to the present embodiment is used, the area on the mask irradiated by the electron beam substantially coincides with the thin film area 10 including the mask pattern area P1, and mask pattern areas other than the mask pattern area P1 are not irradiated by the electron beam.

Figure 4:
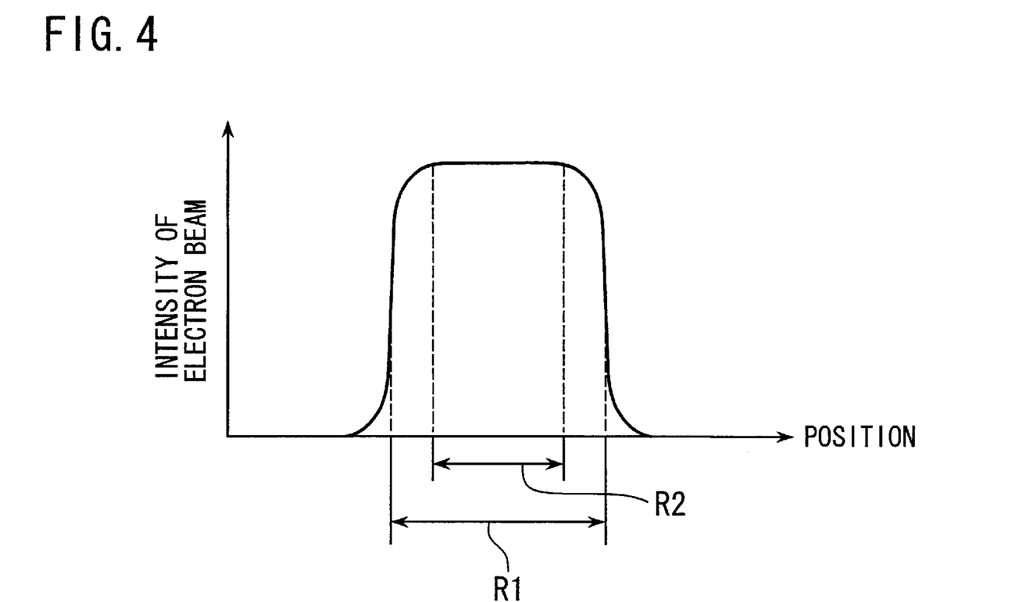
FIG. 4 is a graph showing a schematic distribution of an intensity of an electron beam on a mask for electron beam exposure when the electron beam is irradiated onto the mask for electron beam exposure from an electron gun.

FIG. 4 is a graph showing a schematic distribution of an intensity of an electron beam on a mask for electron beam exposure when the electron beam is irradiated onto the mask for electron beam exposure from an electron gun. An abscissa of the graph shows a location on the mask for electron beam exposure and an ordinate thereof shows an intensity of the electron beam irradiated onto the mask. A range shown by R1 in the graph corresponds to the above-mentioned electron beam irradiation area E1, that is, an electron beam irradiation area of approximately 1 mm square. Also, a range shown by R2 in the graph corresponds to the above-mentioned mask pattern area P1. As can be seen from the graph of FIG. 4, a distribution of intensity of the electron beam within the electron beam irradiation area E1 is approximately uniform except peripheral area. Therefore, a distribution of intensity of the electron beam within the mask pattern area P1 which is smaller than the electron beam irradiation area E1 is approximately uniform. In case the mask pattern areas P1–P9 are substantially equal in size and shape and each of the mask pattern areas P1–P9 is smaller than the electron beam irradiation area E1, various advantageous effects are obtained according to the present invention. Here, in case each of the mask pattern areas P1–P9 is smaller than the electron beam irradiation area E1, each of the mask pattern areas P1–P9 is contained within the electron beam irradiation area E1 when a shaped electron beam is irradiated onto each of the mask pattern area P1–P9. In such case, it is preferable that each of the mask pattern areas P1–P9 is contained within an area in the electron beam irradiation a area E1 where the intensity of the electron beam is substantially uniform, for example, within the range shown by R2 in FIG. 4. By such constitution, it is possible to restrain a degree of beam blur of an electron beam irradiated onto a semiconductor wafer via each mask pattern area. Therefore, it is possible to improve dimensional precision of resist film patterns formed in the mask for electron beam exposure. In this case, it should be noted that each of the mask pattern areas P1–P9 should not be too small taking a throughput in a manufacturing process into consideration.

An electron beam 1B emitted from the electron gun 1 and passed through the mask patterns comprising trenches or openings formed in the mask pattern area P1 is deflected, for example, toward x direction, if necessary, by the deflector 7 and focused by the objective lens 6, and irradiated onto a predetermined area on a semiconductor wafer 9, for example, an area which is to be exposed by the patterns of the subfield F1. Therefore, the resist film on the semiconductor wafer 9 is exposed with patterns obtained by reducing the mask patterns of the mask pattern area P1, that is, patterns of the subfield F1. Thereafter, emission of the electron beam from the electron gun 1 is stopped, and a step of exposure of one shot is completed.

Then, the electron beam 1A is irradiated onto the thin film area 10 including the next mask pattern area, for example, the mask pattern area P2, of the mask for electron beam exposure 5, and the electron beam 1B passed through the mask for electron beam exposure 5 is irradiated onto an area on the semiconductor wafer 9 which is to be exposed by the patterns of the subfield F2. Thereby, the resist film on the semiconductor wafer 9 is exposed with the patterns of the subfield F2.

The location on the mask for electron beam exposure 5 where the electron beam is irradiated and the location on the semiconductor wafer 9 where the electron beam is irradiated can be controlled in any various ways. For example, both locations can be controlled by a combination of intermittently moving the mask stage 4 and the wafer stage 8 while the electron beam from the electron gun 1 is stopped to move the mask for electron beam exposure 5 and the semiconductor wafer 9 in, for example, y direction and of controlling deflection of the electron beam by the deflectors 2 and 7 in, for example, x direction. Instead, it is possible to control both locations by controlling degrees of electron beam deflection by the deflectors 2 and 7 in x and y directions without moving the mask for electron beam exposure 5 and the semiconductor wafer 9. It is also possible to control both locations by intermittently moving the mask stage 4 and the wafer stage 8 to move the mask for electron beam exposure 5 and the semiconductor wafer 9 in x and y directions while stopping irradiation of the electron beam from the electron gun 1, without changing the degrees of deflection of the electron beam by the deflectors 2 and 7 or without deflecting the electron beam by the deflectors 2 and 7. Further, it is possible to control both locations by using any combination of the above-mentioned methods.

Thereafter, similar operations are repeated to sequentially expose areas of the resist film on the semiconductor wafer 9, which are to be exposed with patterns of the subfields F1–F9, with the patterns of the subfields F1–F9. Thereby, the resist film on the semiconductor wafer 9 is exposed with the patterns for a chip 15.

Figure 5:
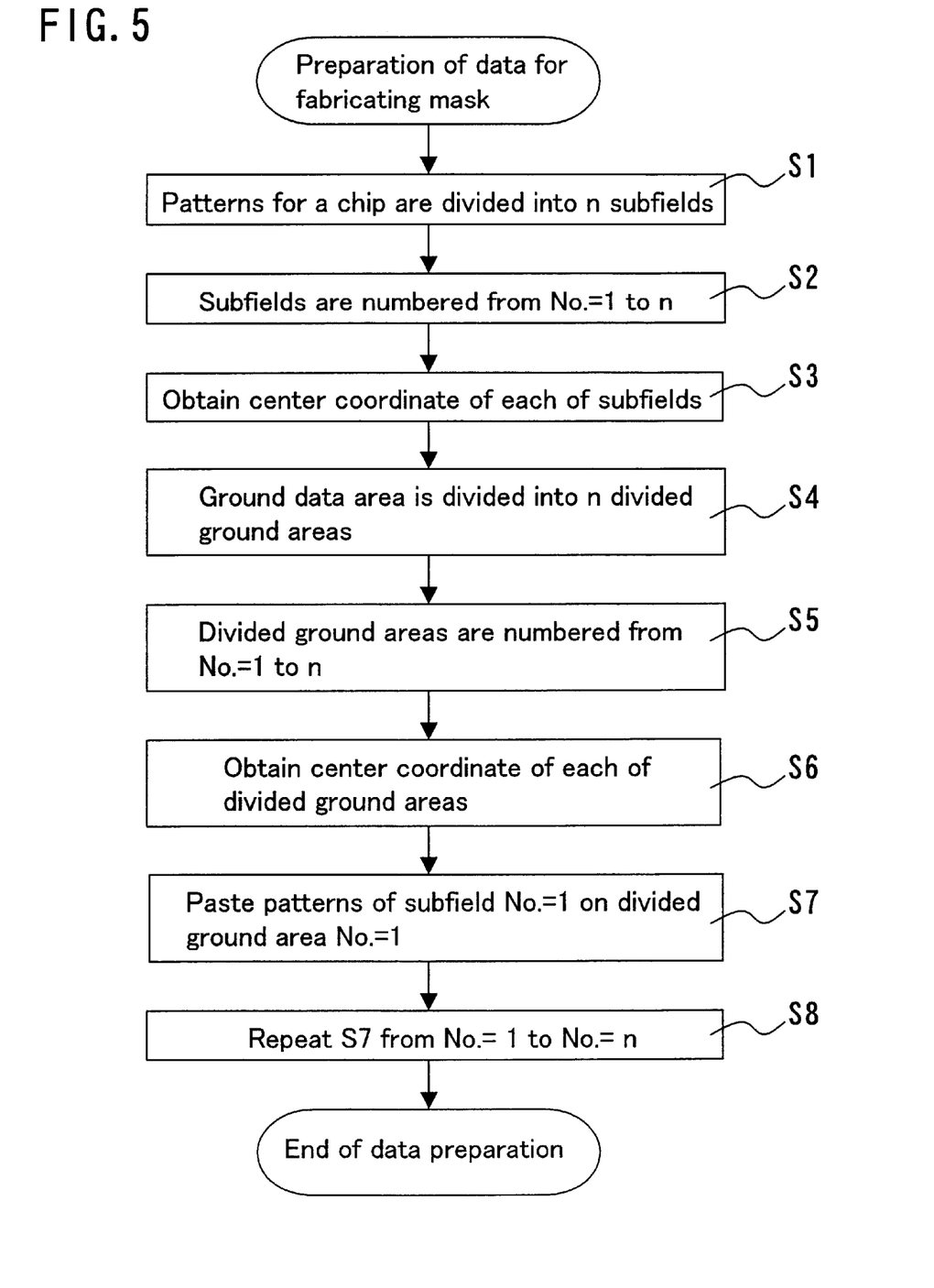
FIG. 5 is a flow chart showing a procedure for preparing data used for fabricating the mask for electron beam exposure according to the present invention.

Now, an explanation will be made on a procedure for preparing data used for fabricating the mask for electron beam exposure according to the present invention. FIG. 5 is a flowchart showing such procedure.

First, a whole patterns for a chip to be formed is divided into n subfields which have substantially the same size and each of which is smaller than the above-mentioned maximum exposure area E2, where n is a natural number (step S1).

Then, the subfields are numbered from No. 1 to No. n (step S2). Then, the coordinates of the center of the subfields 1–n are obtained (step S3).

Next, a ground data area, that is, a blank data area on which a predetermined chip pattern is to be pasted, is divided into n divided ground areas each having the size corresponding to that of the above-mentioned maximum exposure area E2 (step S4). Then, the divided ground areas are numbered from No. 1 to No. n (step S5). Then, the coordinates of the center of the divided ground areas 1–n are obtained (step S6).

The subfield No. 1 is pasted on the divided ground area No. 1, such that the coordinate of the center of the divided ground area No. 1 coincides with the coordinate of the center of the subfield No. 1 (step S7). Steps similar to the step S7 are repeated from No. 1 to No. n (step S8). Thereafter, an operation is made on the data obtained by the above-mentioned steps such that patterns represented by the data are enlarged according to the magnification of the mask for electron beam exposure. Thereby, preparation of data for fabricating the mask for electron, beam exposure is completed.

After the step S8, it is possible to include a step for disposing a grillage area between the divided ground areas.

Also, in place of performing the operation for enlarging the patterns according to the magnification of the mask for electron beam exposure after the step S8, it is possible to perform an operation for enlarging patterns according to the magnification of the mask for electron beam exposure, before the step S1. In such case, in the step S1 thereafter, it is necessary to divide the chip pattern enlarged according to the magnification of the mask for electron beam exposure into n subfilelds which have substantially the same size and each of which is smaller than the above-mentioned electron beam irradiation area E1. Also, in the step S4, it is necessary to divide the ground data area into n divided ground areas each having the size corresponding to that of the electron beam irradiation area E1.

It is also possible to perform the operation of the steps S1–S3 and the operation of the steps S4–S6 simultaneously in parallel. Thereby, a time required for preparing data for fabricating the mask for electron beam exposure can be reduced.

The mask for electron beam exposure can be fabricated based on the data prepared in accordance with the procedure described with reference to FIG. 5. Process for fabricating the mask for electron beam exposure can be done, for example, as follows.

A semiconductor wafer for fabricating a mask, on which an electron beam resist film is formed, is prepared. Based on the data produced by the procedure of FIG. 5, the electron beam resist film on the semiconductor wafer for fabricating a mask, for example, a silicon wafer, is exposed by an electron beam, by using, for example, an electron beam writer, or an electron beam writing apparatus, and the like. A development process is performed to pattern the electron beam resist film. By using the patterned resist film as an etching mask, the semiconductor wafer for fabricating a mask is etched to form trenches or openings having predetermined patterns. By these processes and the like, the mask for electron beam exposure 5 can be fabricated.

As mentioned above, since the size of the mask pattern areas P1–P9 of the mask for electron beam exposure 5 is approximately the same, a proportion of an area of the trenches or openings in each of the mask pattern areas P1–P9 is approximately uniform regardless of the mask pattern areas. Therefore, in a process of etching a wafer for fabricating a mask, the microloading effect is suppressed and an etching rate of each mask pattern becomes approximately uniform. Thus, it is possible to improve a dimensional precision of the mask patterns of the fabricated mask for electron beam exposure.

It should be noted that the present invention concerning the mask for electron beam exposure can be applied to both a stencil mask and a membrane mask.

It is also possible to reduce the width of the non-patterned area 13 of the thin film area 10 without changing the width of the grillage area 12, or to omit the non-patterned area 13. Thereby, the whole size of the mask for electron beam exposure can be reduced. In this case, it is necessary to determine the space between the mask pattern areas such that, when an electron beam is irradiated onto the mask such that the center of the irradiation area of the electron beam on the mask coincides with the center of a mask pattern area, the irradiation area of the electron beam does not overlap other mask pattern area.

In the above, an embodiment of the present invention is explained in which a 4×mask is used as a mask for electron beam exposure, an electron beam is irradiated onto an area of 1 mm square on the mask for electron beam exposure, and an image constituted of an electron beam passed through the mask for electron beam exposure is reduced to ¼ and projected onto a semiconductor wafer. However, the present invention is not limited to such embodiment. The present invention can be applied to a mask for electron beam exposure having a magnification other than the magnification×4. Also, the electron beam irradiation area E1 on the mask for electron beam exposure can be that having a dimension other than 1 mm square, or can be that having a shape other than a square, for example, a rectangle or a triangle.

In the present invention, a mask pattern corresponding to each of subfields which are obtained by dividing a whole chip pattern into subfields having substantially the same size is formed in a mask pattern area within a thin film area surrounded by grillage area. It is necessary that the mask pattern areas have substantially the same shape and size, and that the size of each of the mask pattern areas is smaller than the size of an area on the mask for electron beam exposure on which an electron beam is substantially irradiated by an exposure of one shot, i.e., an electron beam irradiation area E1.

According to the present invention, a whole chip pattern is divided into a plurality of subfields which substantially have the same size, and mask patterns corresponding to each of the subfields are formed in a mask for electron beam exposure. Therefore, the proportion of an area of trenches or openings to each of the mask pattern areas of the mask for electron beam exposure becomes substantially uniform regardless of the mask pattern areas. Thus, in an etching process for fabricating the mask for electron beam exposure, an etching rate of a wafer for fabricating the mask becomes approximately uniform throughout the wafer. As a result thereof, a dimensional precision of mask patterns formed in the mask for electron beam exposure can be greatly improved.

Also, since every mask pattern area has the same size, a quantity of electric charges passed through the mask for electron beam exposure is approximately constant and does not depend on which mask pattern area the electron beam has passed. Therefore, a degree of beam blur and a focusing position of an electron beam projected or irradiated onto a semiconductor wafer do not vary depending on which mask pattern area the electron beam has passed. As a result, it is possible to precisely expose the resist film on the semiconductor wafer with an electron beam having predetermined patterns, and thereby to form predetermined resist film patterns on the semiconductor wafer with precision.

By disposing each mask pattern area in a mask for electron beam exposure such that the center of each mask pattern area coincides with the center of an area between grillage area, it is possible to uniformalize a stress throughout the mask for electron beam exposure. Thereby, a warp or strain of the mask for electron beam exposure can be reduced and a dimensional precision of the mask can be further improved.

In case the width of the grillage area is enlarged such that the mask pattern areas verge on the grillage area, thermal conductivity and mechanical strength of the mask for electron beam exposure can be relatively large. When the thermal conductivity is increased, it is possible to suppress variation of dimensions of mask patterns caused by heat. Also, due to the increase in the mechanical strength, a warp or strain of the mask can be reduced.

Spaces between the mask pattern areas are determined such that when an electron beam is irradiated onto the mask such that the center of the irradiation area of the electron beam on the mask coincides with the center of a mask pattern area, the irradiation area of the electron beam does not overlap other mask pattern area. Therefore, when an electron beam is irradiated on an area including a mask pattern area, it is possible to prevent the electron beam from being irradiated onto an unintended mask pattern area.

By irradiating an electron beam onto a mask such that the center of an electron beam irradiation area on the mask coincides with the center of a mask pattern area, a distribution of an intensity of the electron beam on the mask pattern area becomes uniform. Therefore, it is possible to restrain beam blur of the electron beam irradiated onto a semiconductor wafer, and to improve a dimensional precision of resist film patterns formed on the semiconductor wafer.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A mask for electron beam exposure used in a process for exposing a wafer with predetermined patterns for a chip by an EB projection lithography system, said mask comprising:

a grillage area;

a plurality of thin film areas surrounded by said grillage area and having a thickness thinner than that of said grillage area; and a plurality of mask pattern areas each of which is formed within respective one of said thin film areas, each of said mask pattern areas has mask patterns corresponding to patterns of a subfield obtained by dividing said patterns for a chip into a plurality of areas having substantially the same shape and size.

2. A mask for electron beam exposure as set forth in claim 1, wherein each of said mask pattern areas is smaller than an area irradiated by an electron beam on said mask for electron beam exposure when the electron beam is irradiated onto said mask for electron beam exposure.

3. A mask for electron beam exposure as set forth in claim 1, wherein when the electron beam is irradiated onto said mask for electron beam exposure such that the center of an area irradiated by the electron beam coincides with the center of each of said mask pattern areas, the each of said mask pattern area is included within said area irradiated by the electron beam.

4. A mask for electron beam exposure as set forth in claim 3, wherein when the electron beam is irradiated onto said mask for electron beam exposure such that the center of an area irradiated by the electron beam coincides with the center of each of said mask pattern areas, a distribution of intensity of said electron beam within each of said mask pattern areas is substantially uniform.

5. A mask for electron beam exposure as set forth in claim 1, wherein the center of each of said mask pattern areas substantially resides in the center of each of said thin film areas surrounded by said grillage area.

6. A mask for electron beam exposure as set forth in claim 1, wherein a non-patterned area exists around each of said mask pattern areas and within corresponding one of said thin film areas.

7. A mask for electron beam exposure as set forth in claim 1, wherein each of said mask pattern areas verges on said grillage area.

8. A mask for electron beam exposure as set forth in claim 1, wherein a space between said mask pattern areas is determined such that an area irradiated onto a mask pattern area by the electron beam does not overlap with other mask pattern areas when the electron beam is irradiated onto said mask for electron beam exposure such that the center of an area irradiated by the electron beam coincides with the center of each of said mask pattern areas.

9. A mask for electron beam exposure as set forth in claim 1, wherein the grillage area has a predetermined thickness configured to increase a thermal conductivity of the mask.

10. A mask for electron beam exposure as set forth in claim 1, wherein the grillage area has a predetermined thickness configured to increase a mechanical strength of the mask.

11. A method of manufacturing a semiconductor device which uses an EB projection lithography system, said method comprising:
    exposing a wafer with predetermined patterns for a chip by using a mask for electron beam exposure which mask has:
        a grillage area;
        a plurality of thin film areas surrounded by said grillage area and having a thickness thinner than that of said grillage area; and
        a plurality of mask pattern areas each of which is formed within respective one of said thin film areas, each of said mask pattern areas has mask patterns corresponding to patterns of a subfield obtained by dividing said patterns for a chip into a plurality of areas having substantially the same shape and size;
    wherein said wafer is exposed with predetermined patterns for a chip by performing, for each of said mask pattern areas, a step of irradiating an electron beam onto said mask for electron beam exposure such that the center of an area irradiated by the electron beam coincides with the center of each of said mask pattern areas.

12. A method of manufacturing a semiconductor device as set forth in claim 11, wherein each of said mask pattern areas is smaller than an area irradiated by the electron beam on said mask for electron beam exposure.

13. A method of manufacturing a semiconductor device as set forth in claim 11, wherein when the electron beam is irradiated onto said mask for electron beam exposure such that the center of an area irradiated by the electron beam coincides with the center of each of said mask pattern areas, each of said mask pattern area is included within said area irradiated by the electron beam.

14. A method of manufacturing a semiconductor device as set forth in claim 11, wherein the center of each of said mask pattern areas substantially resides in the center of each of said thin film areas surrounded by said grillage area.

15. A method of manufacturing a semiconductor device as set forth in claim 11, wherein a non-patterned area exists around each of said mask pattern areas and within corresponding one of said thin film areas.

16. A method of manufacturing a semiconductor device as set forth in claim 11, wherein each of said mask pattern areas verges on said grillage area.

17. A method of manufacturing a semiconductor device as set forth in claim 11, wherein a space between said mask pattern areas is determined such that an area irradiated onto a mask pattern area by the electron beam does not overlap with other mask pattern areas when the electron beam is irradiated onto said mask for electron beam exposure such that the center of an area irradiated by the electron beam coincides with the center of each of said mask pattern areas.

18. A mask for electron beam exposure as set forth in claim 11, wherein the grillage area has a predetermined thickness configured to increase a thermal conductivity of the mask.

19. A mask for electron beam exposure as set forth in claim 11, wherein the grillage area has a predetermined thickness configured to increase a mechanical strength of the mask.

* * * * *